US011714388B1

(12) United States Patent
Shrivastava et al.

(10) Patent No.: US 11,714,388 B1
(45) Date of Patent: Aug. 1, 2023

(54) CONDITIONAL ERROR MODELS

(71) Applicants: Ashish Shrivastava, Santa Clara, CA (US); Cuneyt Oncel Tuzel, Cupertino, CA (US); Shahab Kaynama, Mountain View, CA (US)

(72) Inventors: Ashish Shrivastava, Santa Clara, CA (US); Cuneyt Oncel Tuzel, Cupertino, CA (US); Shahab Kaynama, Mountain View, CA (US)

(73) Assignee: APPLE INC., Cupertino, CA (US)

( * ) Notice: Subject to any disclaimer, the term of this patent is extended or adjusted under 35 U.S.C. 154(b) by 1054 days.

(21) Appl. No.: 16/509,536

(22) Filed: Jul. 12, 2019

Related U.S. Application Data

(60) Provisional application No. 62/789,598, filed on Jan. 8, 2019, provisional application No. 62/717,204, filed on Aug. 10, 2018.

(51) Int. Cl.
*G05B 13/02* (2006.01)
*G06N 20/00* (2019.01)
*G06F 30/20* (2020.01)
*G05D 1/00* (2006.01)

(52) U.S. Cl.
CPC .......... *G05B 13/0265* (2013.01); *G06F 30/20* (2020.01); *G06N 20/00* (2019.01); *G05D 1/0088* (2013.01)

(58) Field of Classification Search
CPC ...... G05B 13/0265; G06F 30/20; G06N 20/00; G05D 1/0088
See application file for complete search history.

(56) References Cited

U.S. PATENT DOCUMENTS

| 6,236,908 | B1 | 5/2001 | Cheng et al. |
| 6,804,600 | B1 | 10/2004 | Uluyol et al. |
| 7,313,550 | B2 | 12/2007 | Kulkarni et al. |
| 2007/0203864 | A1 | 8/2007 | Grichnik |

(Continued)

FOREIGN PATENT DOCUMENTS

| CN | 105225006 | A | * | 1/2016 | |
| CN | 108399201 | A | * | 8/2018 | ............ G06F 16/9535 |

OTHER PUBLICATIONS

KHOSROSHAHI, A., et al., "Surround Vehicles Trajectory Analysis With Recurrent Neural Networks", 2016 IEEE 19th International Conference on Intelligent Transportation Systems, Nov. 1, 2016, http://cvrr.ucsd.edu/publications/2016/0202.pdf (6 pp).

(Continued)

*Primary Examiner* — Thomas C Lee
*Assistant Examiner* — Michael Tang
(74) *Attorney, Agent, or Firm* — Young Basile Hanlon & MacFarlane, P.C.

(57) ABSTRACT

A method includes obtaining a time-series of training samples that include one or more states, a ground truth value, an output value produced in the presence of the one or more states, and an actual error value that is defined as a difference between the ground truth value and the output value. The method also includes training a machine learning model using the time-series of training samples such that the machine learning model is configured to determine a condition-dependent error distribution for a current time step based on simulated states for the current time step.

21 Claims, 8 Drawing Sheets

(56) References Cited

U.S. PATENT DOCUMENTS

| | | | |
|---|---|---|---|
| 2008/0154811 A1 | 6/2008 | Grichnik et al. | |
| 2010/0191391 A1* | 7/2010 | Zeng .................... | G01S 13/87 |
| | | | 701/1 |
| 2011/0010138 A1* | 1/2011 | Cheng et al. ........ | G05B 13/042 |
| | | | 703/2 |
| 2013/0021199 A1 | 1/2013 | Fix et al. | |
| 2020/0023855 A1* | 1/2020 | Takhirov et al. ...... | G07C 5/008 |

OTHER PUBLICATIONS

ZUR, R., et al., "Noise Injection for Training Artificial Neural Networks: A Comparison With Weight Decay and Early Stopping", Published Sep. 25, 2009, 2009 Am. Assoc. Phys. Med., Med. Phys. 36 (10), https://www.ncbi.nlm.nih.gov/pmc/articles/PMC2771718 (9 pp).

* cited by examiner

CONDITIONAL ERROR MODELS

CROSS-REFERENCE TO RELATED APPLICATIONS

This application claims the benefit of U.S. Provisional Application No. 62/717,204, filed on Aug. 10, 2018 and U.S. Provisional Application No. 62/789,598, filed on Jan. 8, 2019, the contents of which are incorporated by reference herein in their entireties for all purposes.

TECHNICAL FIELD

This disclosure relates to modeling the behavior of agents in a simulation.

BACKGROUND

Some real-world systems are subject to errors. As an example, sensor systems may be subject to errors, and systems that make predictions based on sensor systems may be subject to errors. In addition to errors attributable to the performance of a system under a particular set of circumstances, errors may also be attributable to faulty assumptions about the underlying world.

SUMMARY

Systems and methods for determining a conditional error model for simulations are described herein.

One aspect of the disclosure is a method that includes obtaining a time-series of training samples that include one or more states, a ground truth value, an output value produced in the presence of the one or more states, and an actual error value that is defined as a difference between the ground truth value and the output value. The method also includes training a machine learning model using the time-series of training samples such that the machine learning model is configured to determine a condition-dependent error distribution for a current time step based on simulated states for the current time step.

In some implementations of the method, training the machine learning model is performed by minimizing a loss function that is based on a log-likelihood of a time-series of error samples from the condition-dependent error distribution.

The machine learning model may be configured to determine the condition-dependent error distribution for the current time step based further on a prior error value. The prior error value may be sampled from the condition-dependent error distribution from an immediately prior time step relative to the current time step.

The condition-dependent error distribution may be described by a mean error value and a standard deviation value. The output value may be an estimate of the ground truth value that is determined based on the one or more states. The one or more states may be measured using sensors. The one or more states may be measured by analyzing images.

Some implementations of the method include, subsequent to training the machine learning model, performing one or more iterations of a simulation. Each iteration of the simulation includes determining a condition-dependent error distribution for a current time step using the machine learning model based on simulation states for the current time step, sampling an error value from the condition-dependent error distribution for the current time step, adding the error value to a simulated value to define an error-adjusted simulated value, and updating the simulation states for the current time step based in part on the error-adjusted simulated value.

Another aspect of the disclosure is a method that includes obtaining training samples that include one or more observed conditions, a ground truth value, an output value from a sensing system, and an error value that is defined as a difference between the ground truth value and the output value. The method may also include training a machine learning model using the training samples such that the machine learning model is configured to determine a condition-dependent error distribution for a current time step based on simulated conditions for the current time step.

Training the machine learning model may be performed by minimizing a loss function that is based on a log-likelihood of a time series of error samples from the condition-dependent error distribution. The machine learning model may be configured to determine the condition-dependent error distribution for the current time step based further on a prior error value from the condition-dependent error distribution. The prior error value may be sampled from the condition-dependent error distribution determined in an immediately prior time step relative to the current time step. The condition-dependent error distribution may be described by a mean error value and a standard deviation value.

The sensing system may include one or more sensors and a sensing algorithm that determines the output value based on sensor signals from the one or more sensors. The sensor signals from the one or more sensors may represent measurements made relative to an object, and the output value of the sensing algorithm may include a location of the object. The output value of the sensing algorithm may further include a rotational orientation of the object. The output value of the sensing algorithm may further include a velocity of the object. The one or more observed conditions may be determined by analyzing images.

Some implementations of the method include, subsequent to training the machine learning model, performing one or more iterations of a simulation. Each iteration of the simulation includes determining a condition-dependent error distribution for a current time step using the machine learning model based on simulation states for the current time step, sampling an error value from the condition-dependent error distribution for the current time step, adding the error value to a simulated value to define an error-adjusted simulated value, and updating the simulation states for the current time step based in part on the error-adjusted simulated value.

Another aspect of the disclosure is a method that includes determining a condition-dependent error distribution for a current time step using a trained machine learning model based on simulation states for the current time step, sampling an error value from the condition-dependent error distribution for the current time step, adding the error value to a simulated value to define an error-adjusted simulated value, and updating the simulation states for the current time step based in part on the error-adjusted simulated value.

The trained machine learning model may be configured to determine the condition-dependent error distribution for the current time step based further on a prior error value. The prior error value may be sampled from the condition-dependent error distribution from an immediately prior time step relative to the current time step. The condition-dependent error distribution may be described by a mean error value and a standard deviation value.

DETAILED DESCRIPTION

The systems and methods that are described herein determine error models that are conditioned upon states under which the errors occur. Errors may also be referred to as noise or deviations from ground truth.

The systems and methods that are described herein can be used to determine error models are used to estimate errors for use in simulations based on conditions present in the simulation. Error is modeled and added to aspects of the simulation so that an otherwise error-free simulation will better model real-world conditions, which generally include errors.

Many applications like autonomous navigation, human-robot interaction, gameplaying robots, etc., use simulation to reduce the cost of real-world testing. Furthermore, some machine learning algorithms like reinforcement learning use simulation for training the model. To achieve reliable results, the conditions present in the simulator should be an accurate representation of the conditions that would be experienced in the real-world environment. However, simulators are often based on manually designed rules and ignore the stochastic behavior of real-world measurements.

As an example, consider a robot that utilizes a distance sensor as an input to an autonomous control system. Under certain conditions, the distance sensor may output a measured distance value that deviates from an actual (ground truth) distance value, and this deviation is an error that is present in the real-world system. If a simulation ignores this error and instead uses an error-free distance measurement, the behavior of the autonomous control system in the simulation will not accurately represent the behavior of the autonomous control system in the real world.

A machine learning model can be used to learn the inaccuracies incurred by a system that captures time-series data in the real world. The trained machine learning model is then able to model these errors during a simulation in order to better represent real-world conditions. As an example, time series data captured by perception algorithms could represent the states of dynamic objects in an autonomous navigation application at each of multiple time steps.

The distribution of residuals (errors) between the ground truth states and their perceived states depends both on the current state of the system (e.g. for a perception system, distance of the objects from the sensor) and its past residuals. This error distribution may be modeled using a conditional Gaussian.

Figure 1:
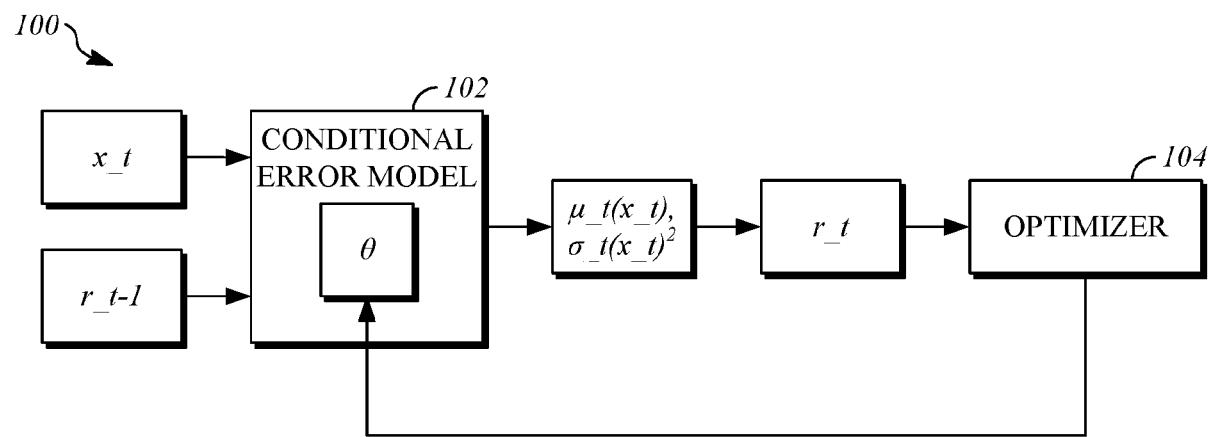
FIG. 1 is an illustration that shows a system from training a conditional error model.

FIG. 1 is an illustration that shows a system 100 for training a conditional error model 102. The conditional error model 102 is implemented using a machine learning model, such as a deep neural network (DNN), and is configured to estimate an error distribution that is conditioned on one or more states that are included in a feature vector $x_t$ that is received by the conditional error model 102 as an input for a current time step t. The error distribution is modeled by a Gaussian with a mean value $\mu_\theta(x_t)$ and standard deviation value $\sigma_\theta(x_t)^2$, where $\theta$ represents the parameters of the conditional error model 102.

To estimate an error value $r_t$ at the current time step t, the error distribution is conditioned on one or more of the states from the feature vector $x_t$ that are present during the time step t, and the error value is determined by sampling from the error distribution. The conditional error model can be trained to estimate the error distribution using the pairs of ground truth states $\hat{s}_t$ and corresponding estimated states $s_t$, which may be values that are included in the feature vector $x_t$. Errors are defined as the difference between the estimated states $s_t$ and the ground truth states $\hat{s}_t$, which can be written as:

$$\hat{r}_t \triangleq s_t - \hat{s}_t \qquad (1)$$

The feature vector $x_t$ is determined for each time step t and may include properties from the environment and object states. Samples from the error distribution are denoted by $\hat{r}_t$ and the feature vector $x_t$ at time t. As an example, for the perception module in an autonomous system, the feature vector $x_t$ can include absolute and relative pose and velocity of objects with respective to the sensors, properties of the environment such as the local map, occlusions, or any variable that the error can be conditioned on.

In practice, it may be difficult to find the corresponding pairs of the simulated values and the real measurements which makes it difficult to compute $\hat{r}_t$. Returning to the example of a perception module in an autonomous vehicle, high precision sensors may be mounted on agents (e.g., human-controlled or autonomously controlled movable objects) in the real environment for reference measurements, and these reference measurements are used as a proxy to the simulated data. The residual between the high precision sensor measurements and the output of a perception module can be used as error samples $\hat{r}_t$ for training the conditional error model.

The system 100 includes an optimizer 104 that is configured to train the conditional error model by modifying the parameters $\theta$ of the conditional error model 102. As one example, the optimizer 104 can be implemented as an RMSprop optimizer. The optimizer 104 trains the conditional error model 102 by minimizing a loss function that is based on a log-likelihood of a time-series of error samples from the condition-dependent error distribution. The log-likelihood quantifies how well the conditional error model 102 explains the data, on a held-out dataset using the trained model, and considers both the prediction error as well as the uncertainty. The log-likelihood $L(\theta)$ of the error samples can be written shown in Equation 2, in which the term const is a constant value that is greater than zero.

$$\mathcal{L}(\theta; x_t) = \sum_t (\mu_\theta(x_t) - \hat{r}_t)^2 \sigma_\theta(x_t)^{-2} + 2\log \sigma_\theta(x_t) + const \quad (2)$$

To learn the correlation across the time, the previous error sample $r_{t-1}$ is input to the conditional error model 102. The likelihood function can be denoted as $L(\theta; x_t, r_{t-1})$. Here $r_t$ is a sample from the learned error distribution: $r_t \sim N(\mu_t, \sigma_t)$ while $\hat{r}_t$ represents the training data (or perception error) samples. To learn the parameters $\theta$ of the conditional error model 102, the following optimization problem is solved:

$$\min_\theta \mathcal{L}(\theta; x_t, r_{t-1}) + \mathcal{L}(\theta; x_{t+1}, r_t) + \cdots + \mathcal{L}(\theta; x_{t+T}, r_{t+T-1}) \quad (3)$$

In Equation 3, T is the time horizon. This multi-step prediction requires sampling from the predicted model, which is a non-differentiable operation. This can be avoided using a well-known re-parameterization technique from variational autoencoders where, to compute the sample $r_t$ from the error distribution output by the conditional error model at the current time step, a sample is taken from a zero mean and unit variance Gaussian, and scaled by the standard deviation $\sigma_t$ at the current time step and added to the mean $\mu_t$ at the current time step.

In one implementation, a two layer fully connected DNN is used to implement the conditional error model 102, but different architectures can be used. The conditional error model 102 can be a simple form of a recurrent neural network (RNN) where the output is fed back to the input and the parameters are shared across time. At inference time, one sample at a time is predicted with a forward pass through the network.

The system 100 may be applied, for example, to model the errors in estimates generated by a perception system in an autonomous navigation application. The states of the objects in the environment may include positions, velocities, and orientations. To obtain the ground truth data, the objects in the real world are instrumented with high precision location sensors. The training data consists of the residual between the measured values with the perception module and the ground truth from a high precision sensor.

Figure 2:
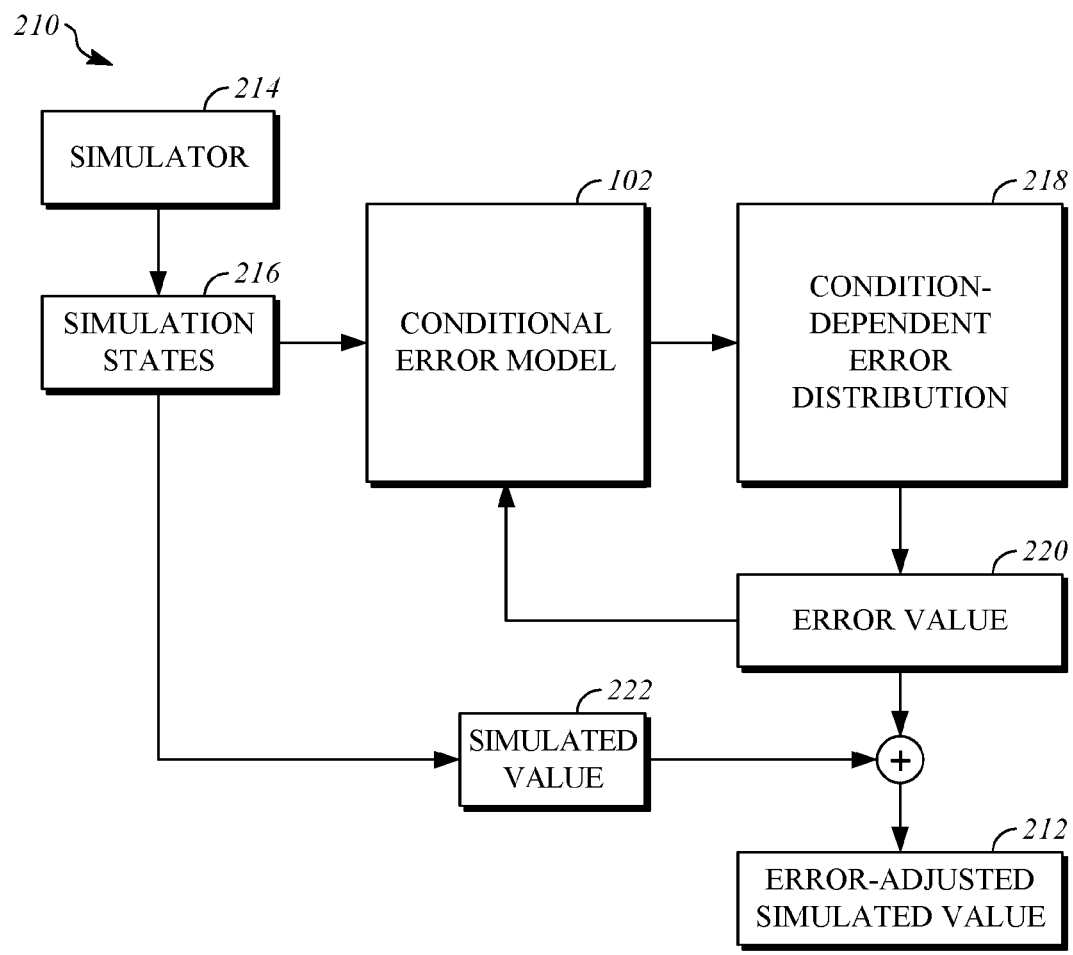
FIG. 2 is an illustration that shows a system for determining an error-adjusted simulation value using the conditional error model.

FIG. 2 is an illustration that shows a system 210 for determining an error-adjusted simulated value 212 using the conditional error model 102. The system 210 is implemented using a simulator 214 that determines simulation states 216 at each time step from a series of time steps. As an example, the simulator 214 can simulate the states of simulated objects in a simulated environment according to control inputs or rules that dictate behavior of the simulated objects. In such an example, the simulation states 216 could include values that describe the positions, orientations, velocities, and accelerations of the objects. As one example, the simulated objects may represent mobile artificial intelligence objects that are moved using outputs from automated control routines implemented using any suitable method such as rule-based control or a trained machine learning model.

The simulation states 216 are provided as input to the conditional error model 102 that is configured to determine a condition-dependent error distribution 218. As previously discussed, the conditional error model 102 also receives a prior error value as an input. For example, the prior error value may be an error value that is sampled from the condition-dependent error distribution 218 from an immediately prior time step relative to the current time step.

The conditional error model 102 is configured to determine the condition-dependent error distribution 218 at each time step based on one or more state values from the simulation states 216 and, in some implementations, based further on the prior error value. As described previously, the condition-dependent error distribution 218 may be modeled described by a mean error value and a standard deviation value.

At each time step, an error value 220 for the current time step is determined by sampling from the condition-dependent error distribution 218. Sampling can be performed using convention statistical methods that, for a large number of samples generated, generate samples that follow the parameters that describe the condition-dependent error distribution 218 (e.g., the mean value and the standard deviation value).

The error value 220 is an estimate of an error that would be experienced in a real-world system for a real-world value that is represented by a simulated value 222 in the system 210. The simulated value 222 and the error value 220 are used to determine the error-adjusted simulated value 212, for example, by addition. The error-adjusted simulated value 212 can then be used in the simulation, such as by updating the simulation states 216 for the current time step based in part on the error-adjusted simulated value.

As previously mentioned, the systems and methods described above can be applied to simulation sensing systems in autonomous vehicle navigation and control simulations. An example of such an implementation will now be described with reference to FIGS. 3-6.

Figure 3:
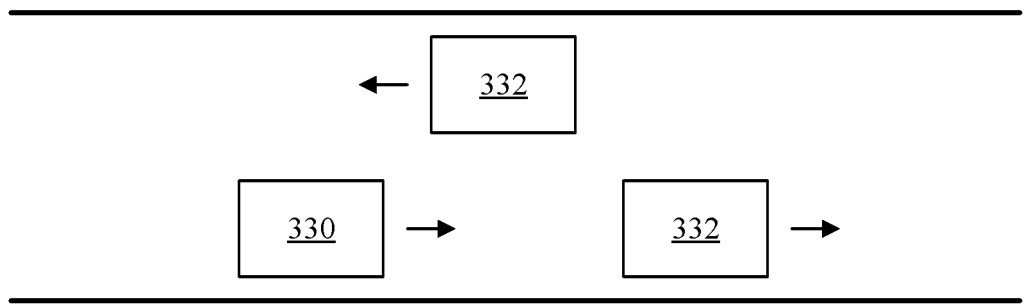
FIG. 3 is an illustration that shows a subject vehicle and dynamic objects during real world data collection.

FIG. 3 is an illustration that shows a subject vehicle 330 and dynamic objects 332 during real world data collection and is an example of a data collection scenario that can be used to provide data for determining a conditional error model for simulations. As an example, the subject vehicle 330 may be an autonomous vehicle or may be a human-operated vehicle, and the dynamic objects 332 may be vehicles, persons, bicycles, or other types of dynamic objects. The subject vehicle 330 and the dynamic objects 332 have states, such as location, heading, and velocity, and these states can be measured and recorded.

Figure 4:
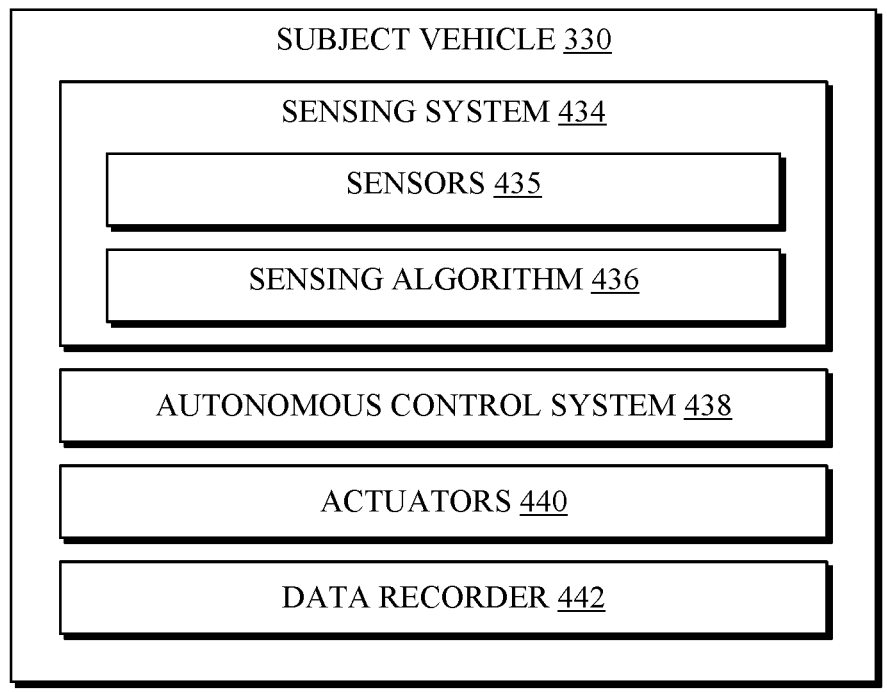
FIG. 4 is a block diagram that shows a hardware configuration that can be used to implement the subject vehicle.

FIG. 4 is a block diagram that shows a hardware configuration that can be used to implement the subject vehicle 330. In the illustrated example, the subject vehicle 330 includes a sensing system 434, an autonomous control system 438, actuators 440, and a data recorder 442.

The sensing system 434 can include sensors 435 and a sensing algorithm 436 that uses information that is output by the sensor 435. The sensors 435 are operable to output observations of states of objects near the subject vehicle 330, including observations regarding the dynamic objects 332. Information corresponding to these observations is referred to herein as sensor information. The sensors 435 can include two-dimensional and/or three-dimensional sensors that are operable to obtain images and/or measurements of features in the surrounding environment, and the sensor information that is obtained by the sensors 435 can include two-dimensional sensor outputs and three-dimensional sensor outputs. As an example, the two-dimensional sensor outputs from the sensors 435 can be images from a still camera or a video camera that obtains visible spectrum images or infrared spectrum images. As an example, the three-dimensional sensor outputs from the sensors 435 can be three-dimensional point clouds obtained from a lidar sensor, a structured-light-stereo sensor, or any other suitable three-dimensional sensing system. The sensor information that is obtained by the sensors 435 can include other types of measurements, such as position, velocity, heading, and acceleration measurements from sensor components such as a satellite positioning sensor, an inertial measurement unit, and an electronic compass.

The outputs of the sensors 435 can be used as inputs by the sensing algorithm 436 of the sensing system 434. The sensing algorithm 436 is operable to estimate states of the dynamic objects 332 using the outputs of the sensing system 434. As an example, the sensing algorithm 436 can output estimates of locations, velocities, headings, accelerations, and/or other states of the dynamic objects 332. As one example, known machine vision algorithms can be used to analyze an image and determine the presence, position, and orientation of an object. As another example, known three-dimensional analysis algorithms can be used to analyze three-dimensional point cloud data and estimate the locations of surfaces, objects, and other features.

As will be explained herein, the outputs of the sensing algorithm 436, which may be referred to as state estimates, differ from the actual states of the dynamic objects 332. The differences are, at least in part, a function of errors in the sensor inputs and limitations on the ability of the sensing algorithm 436 to accurately predict the states of the dynamic objects 332.

The autonomous control system 438 is operable to control the subject vehicle 330 using inputs received from the sensing algorithm 436. The autonomous control system 438 may be implemented in the form of software that is executed by a computing device of any type, including general-purpose computing devices, and special purpose computing devices. As an example, the autonomous control system 438 could be implemented using a neural network or a rules-based system, other technologies, or a combination of technologies to implement desired control behaviors. For instance, the autonomous control system 438 could be configured to receive a desired trajectory, follow the desired trajectory at a certain velocity, and change the velocity and/ or the trajectory in response to determining, based on outputs from the sensing system 434, that an obstruction is present along the trajectory.

As outputs, the autonomous control system 438 may send commands to the actuators 440. As examples, the actuators 440 may include propulsion actuators, braking actuators, steering actuators, and suspension actuators. The commands sent to the actuators may cause motion of the subject vehicle 330.

The data recorder 442 is operable to store information during operation of the subject vehicle 330. As an example, the data recorder 442 may record data representing states that were estimated by the perception system, such as locations, headings, and velocities of the dynamic objects 332.

Figure 5:
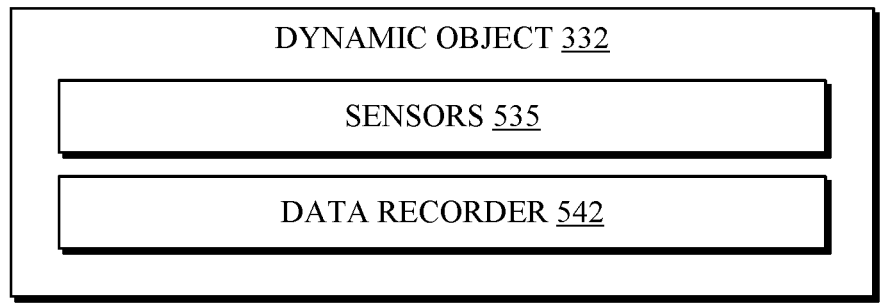
FIG. 5 is a block diagram that shows a hardware configuration that can be used to implement the dynamic objects.

FIG. 5 is a block diagram that shows a hardware configuration that can be used to implement the dynamic objects 332. The dynamic objects 332 may, in some cases, include components that are able to cause and/or control motion of the dynamic objects, such as a manual or autonomous control system and actuators, which may be implemented according to the description of the subject vehicle 330. The dynamic objects 332 also include sensors 535 and a data recorder 542, which may be implemented as described with respect to the sensors 535 and the data recorder 442, to measure and record information describing the actual states of the dynamic objects 332.

Figure 6:
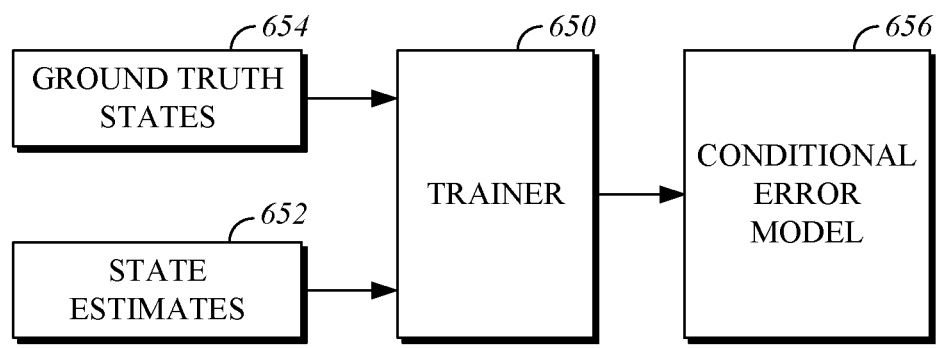
FIG. 6 is a block diagram that shows a trainer.

FIG. 6 is a block diagram that shows a trainer 650. The trainer 650 receives, as inputs, state estimates 652 and ground truth states 654 (i.e., measured states). The trainer 650 uses these outputs to train a conditional error model 656, which may be a machine learning based model such as a DNN. The state estimates 652 and the ground truth states 654 are determined by experimentation, as described with respect to the subject vehicle 330 and the dynamic objects 332. In particular, the state estimates 652 may be the information that is output by the sensing algorithm 436 of the subject vehicle 330 and recorded by the data recorder 442. The ground truth states 654 may be the information that is output by the sensors 535 of the dynamic objects 332 and recorded by the data recorder 542. The state estimates 652 and the ground truth states 654 include time information that can be used to correlate the estimates contained in the state estimates 652 with measurements from the ground truth states 654 so that an actual error value can be determined and used by the trainer 650. The error value represents the error in the state estimates 652, and the trainer uses the actual error value along with the ground truth states 654 for a particular moment in time to train the conditional error model 656 to predict the error that will occur is correspondence to a certain state or set of states for dynamic objects that are encountered by a subject vehicle.

Figure 7:
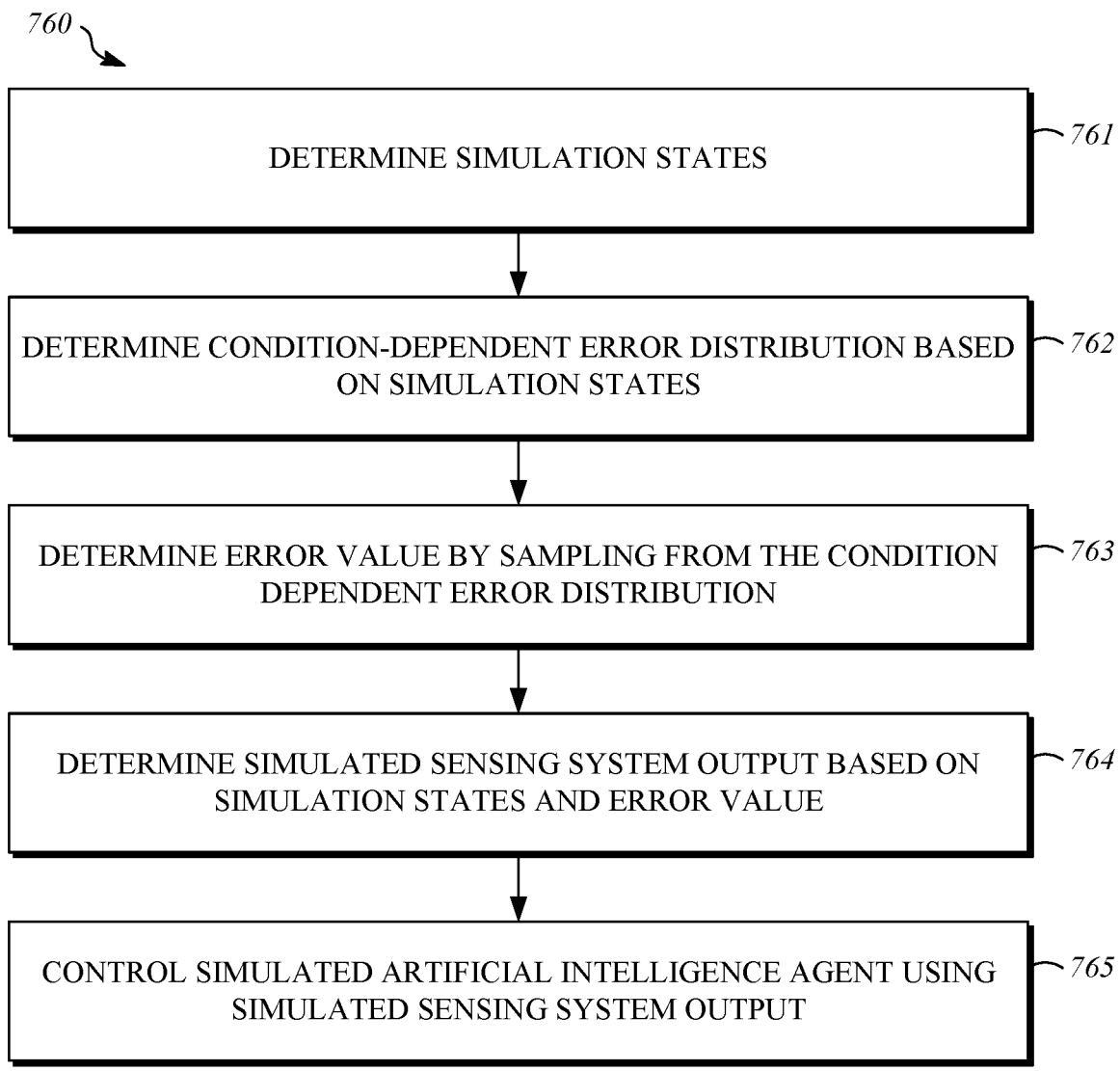
FIG. 7 is flowchart that shows an example of a process for simulating dynamic objects.

FIG. 7 is flowchart that shows an example of a process 760 for simulating dynamic objects. The process 760 can be executed using a computing device such as one or more processors that execute instructions that are stored in memory. The instructions cause performance of the process 760 by the computing device. Alternatively, the process 760 can be implemented directly in hardware, firmware, or software, circuitry, or a combination thereof. The process 760 can be implemented, for example, using the systems previously discussed with reference to FIGS. 1-6.

In operation 761, simulated actual states are determined for simulated dynamic objects. The simulated actual states represent the condition of the simulated dynamic objects in a simulation environment. The simulated dynamic objects exist in the simulation model according to the simulated actual states, further states of the simulated dynamic objects are modeled using the simulated actual states, and interactions with other objects (e.g., collisions) are modeled according to the simulated actual states.

In operation 762 and operation 763, error values are determined for each of the dynamic objects. Operation 762 includes determining a condition-dependent error distribution using the simulated actual states as inputs to the conditional error model, as previously described. The conditional error model may also use a prior error sample from a previous time step to determine the condition-dependent error distribution for the current time step. In operation 763, an error value for each of the simulated dynamic objects may be determined, for example, by sampling from the condition-dependent error distribution using conventional sampling methods. The error values determined in operation 762 may represent, for example, simulated sensing errors for determining the states that a simulated artificial intelligence agent will perceive using its sensing system.

In operation 764, a simulated sensing system output (i.e., a perceived state) is determined for each of the dynamic objects by combining (e.g., adding) the sampled error values determined in operation 763 with the actual simulated state values determined in operation 761.

In operation 765, the artificial intelligence agent is controlled using the perceived state values. In particular, the perceived state values are used as outputs of a perception system of the simulated artificial intelligence agent, and thus as inputs of an automated control system of the simulated artificial intelligence agent. Control decisions are made for the simulated artificial intelligence agent using these inputs, and the states of the artificial intelligence agent are updated in the simulation.

Figure 8:
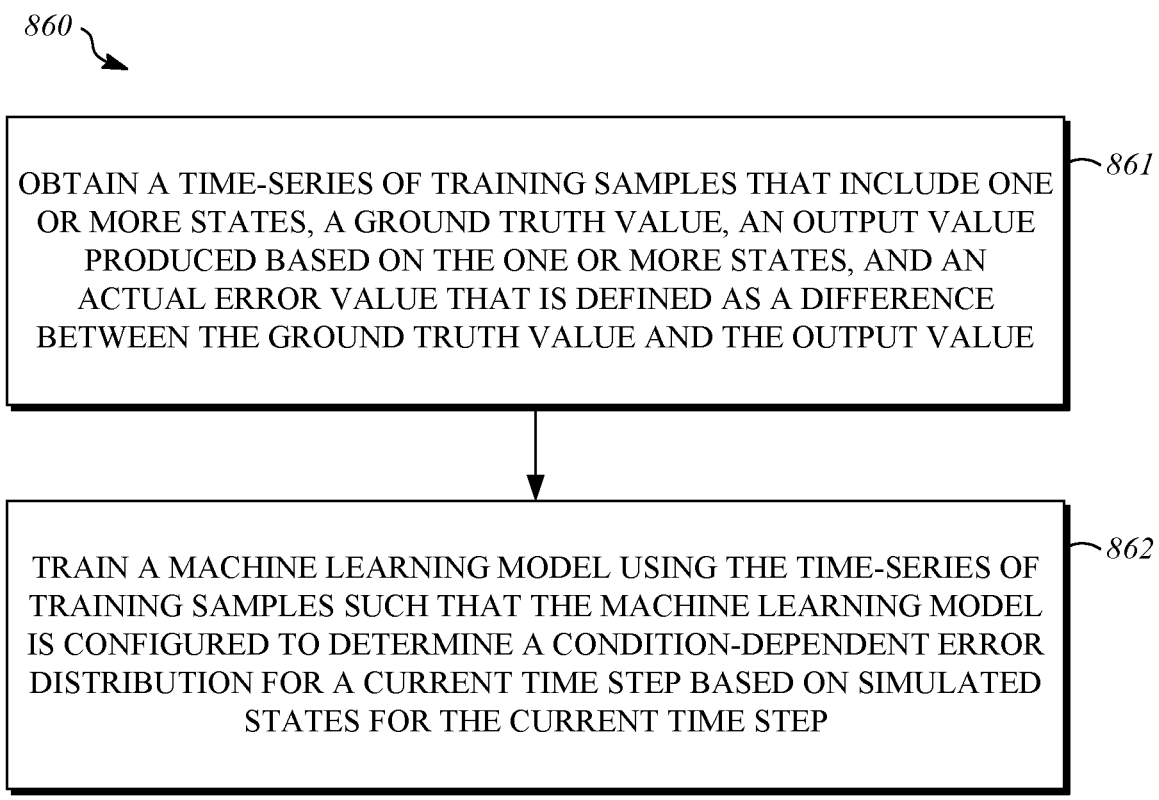
FIG. 8 is flowchart that shows an example of a process for training a conditional error model.

FIG. 8 is flowchart that shows an example of a process 860 for training a conditional error model. The process 860 can be executed using a computing device such as one or more processors that execute instructions that are stored in memory. The instructions cause performance of the process 860 by the computing device. Alternatively, the process 860 can be implemented directly in hardware, firmware, or software, circuitry, or a combination thereof. The process 860 can be implemented, for example, using the systems previously discussed with reference to FIGS. 1-6.

Operation 861 includes obtaining a time-series of training samples that include one or more states, a ground truth value, an output value produced based on the one or more states, and an actual error value that is defined as a difference between the ground truth value and the output value. The output value may be an estimate of the ground truth value that is determined based on the one or more states, and the one or more states are measured using sensors. The states may be obtained in the manner described with respect to the state estimates 652, such as by analyzing images or other sensor outputs using a perception system. The ground truth value may be obtained in the manner described with respect to the ground truth states 654.

Operation 862 includes training a machine learning model using the time-series of training samples such that the machine learning model is configured to determine a condition-dependent error distribution for a current time step based on simulated states for the current time step. The condition-dependent error distribution may be described by a mean error value and a standard deviation value.

In some implementations, training the machine learning model in operation 862 is performed by minimizing a loss function that is based on a log-likelihood of a time-series of error samples from the condition-dependent error distribution. In some implementations, the machine learning model is configured to determine the condition-dependent error distribution for the current time step based further on a prior error value. The prior error value is sampled from the condition-dependent error distribution from an immediately prior time step relative to the current time step.

Figure 9:
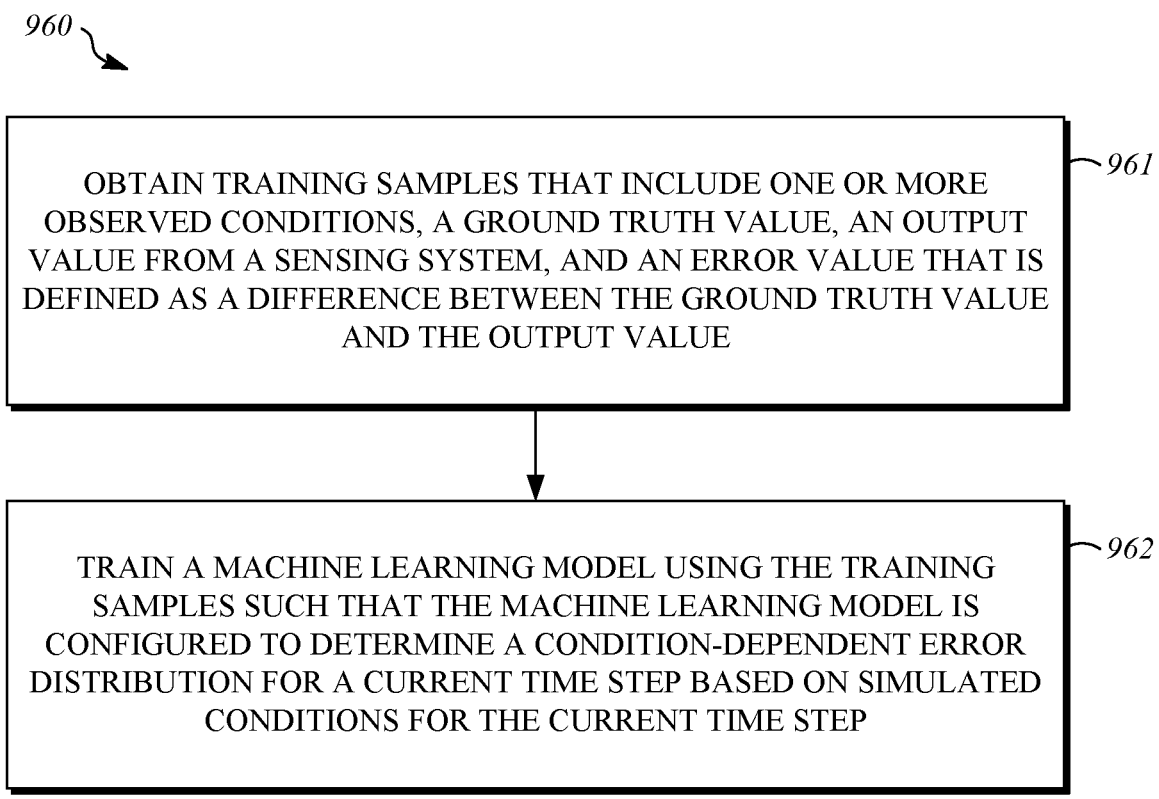
FIG. 9 is flowchart that shows an example of a process for training a conditional error model.

FIG. 9 is flowchart that shows an example of a process 960 for training a conditional error model. The process 960 can be executed using a computing device such as one or more processors that execute instructions that are stored in memory. The instructions cause performance of the process 960 by the computing device. Alternatively, the process 960 can be implemented directly in hardware, firmware, or software, circuitry, or a combination thereof. The process 960 can be implemented, for example, using the systems previously discussed with reference to FIGS. 1-6.

Operation 961 includes obtaining training samples that include one or more observed conditions, a ground truth value, an output value from a sensing system, and an error value that is defined as a difference between the ground truth value and the output value. The observed conditions may be obtained in the manner described with respect to the state estimates 652, such as by analyzing images or other sensor outputs using a perception system. The ground truth value may be obtained in the manner described with respect to the ground truth states 654.

Operation 962 includes training a machine learning model using the training samples such that the machine learning model is configured to determine a condition-dependent error distribution for a current time step based on simulated conditions for the current time step.

In some implementations, training the machine learning model is performed by minimizing a loss function that is based on a log-likelihood of a time series of error samples from the condition-dependent error distribution. The condition-dependent error distribution may be described by a mean error value and a standard deviation value.

The machine learning model may be configured to determine the condition-dependent error distribution for the current time step based further on a prior error value from the condition-dependent error distribution. The prior error value may be sampled from the condition-dependent error distribution determined in an immediately prior time step relative to the current time step.

The sensing system may include one or more sensors and a sensing algorithm that determines the output value based on sensor signals from the one or more sensors. The sensor signals from the one or more sensors may represent measurements made relative to an object. The output value of the sensing algorithm may include a location of the object, a rotational orientation of the object, and/or a velocity of the object.

Figure 10:
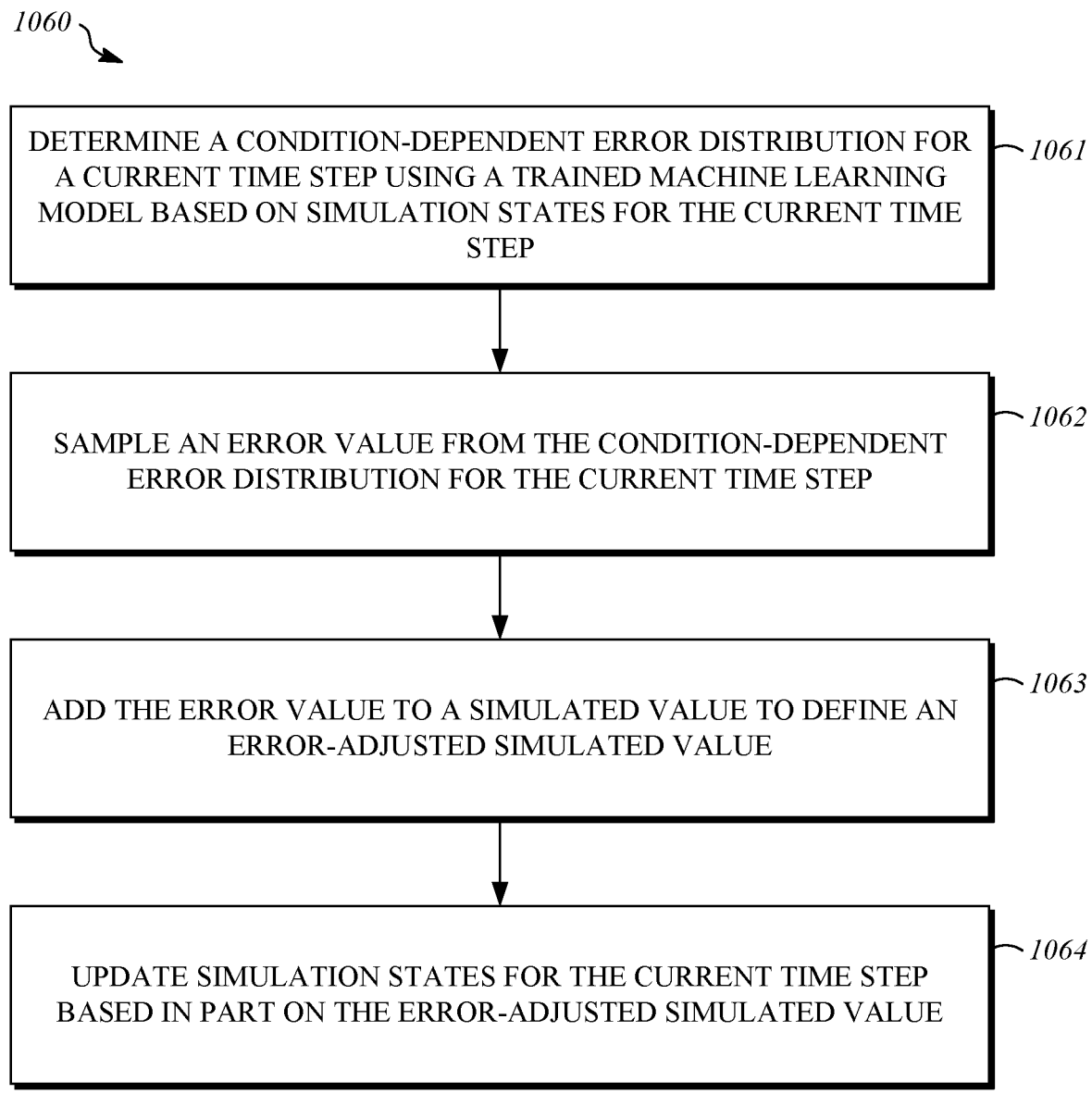
FIG. 10 is flowchart that shows an example of a process for performing a simulation using a conditional error model.

FIG. 10 is flowchart that shows an example of a process 1060 for performing a simulation using a conditional error model. The process 1060 can be executed using a computing device such as one or more processors that execute instructions that are stored in memory. The instructions cause performance of the process 1060 by the computing device. Alternatively, the process 1060 can be implemented directly in hardware, firmware, or software, circuitry, or a combination thereof. The process 1060 can be implemented, for example, using the systems previously discussed with reference to FIGS. 1-6.

In operation 1061, a condition-dependent error distribution is determined for a current time step using a trained machine learning model based on simulation states for the current time step. The condition-dependent error distribution may be described by a mean error value and a standard deviation value. The trained machine learning model may be configured to determine the condition-dependent error distribution for the current time step based further on a prior error value. The prior error value may be sampled from the condition-dependent error distribution from an immediately prior time step relative to the current time step.

In operation 1062, an error value is sampled from the condition-dependent error distribution for the current time step. As an example, conventional sampling methods can be used to determine the error value based on the condition-dependent error distribution for the current time step, such as by generating a group of values (e.g., one hundred values) using the condition-dependent error distribution, and randomly selecting the error value from the group of values.

In operation 1063, the error value is added to a simulated value to define an error-adjusted simulated value, and in operation 1064 simulation states for the current time step are updated based in part on the error-adjusted simulated value. For example, the error adjusted-simulation value can be included in the simulation states for the current time step.

It should be understood that the systems and methods described herein can be applied to modeling errors for any system that is prone to errors that are influenced by conditions, such as environmental conditions. The conditional error models described herein can be applied to modeling complex systems, including those where the relationship between conditions and errors cannot be readily understood by manual analysis methods, since the conditional error model is learned using machine learning techniques, such as a DNN.

The systems and methods described above can be applied to a number of different use cases.

In one example use case, a conditional error model is defined to simulate errors for a first version of an error prone system. A second version of the error prone system is then made by modifying the first version of the error prone system. Simulations are performed using the first and second models of the error prone system to simulate the errors generated under various conditions, in order to determine relative performance of the first and second versions of the error prone system.

In a second example use case, a system includes a first component and a second component. The second component uses an output of the first component. A conditional error model is defined to model errors generated by the first component, which are added to the output of the first component. The conditions under which the first component is operating are perturbed to increase the errors generated by the first component until the second component fails. As an example, failure of the second component can be evaluated by comparing an output of the second component to an expected output, where failure is defined by a deviation above a threshold value.

As another example, a conditional error model can be defined to allow the behavior of an artificial intelligence agent to better model a desired behavior. For example, a conditional error model can be defined to add errors to computer-control of a video game character (e.g., to model walking motion more naturally).

As another example, a conditional error model can be used to estimate the amount of error that system is subject to in real time, and this estimate can be used as a control parameter, such as by exercising more conservative control over motion of an autonomous vehicle (e.g., reduced speeds) when errors are high.

Figure 11:
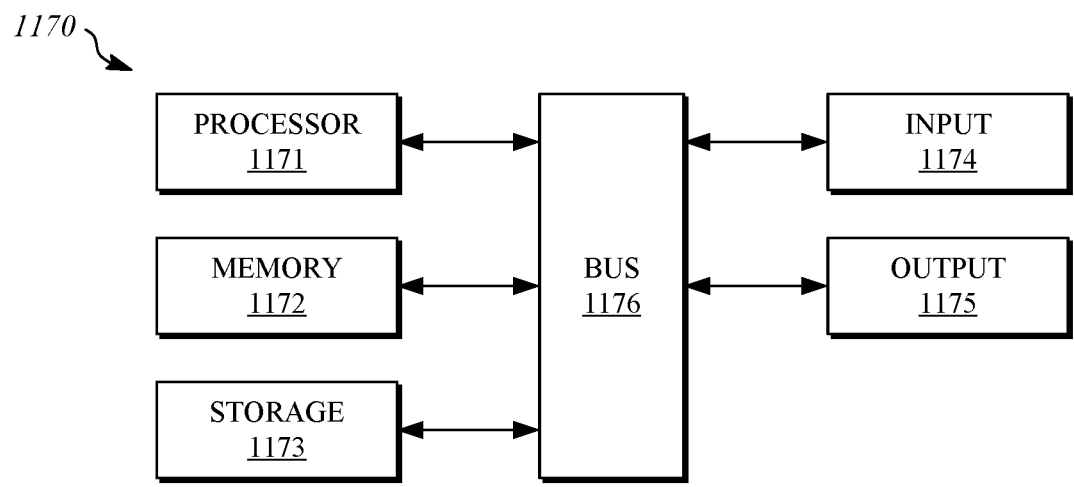
FIG. 11 is an illustration that shows an example of a hardware configuration for a computing device.

FIG. 11 is an illustration that shows an example of a hardware configuration for a computing device that can be used to implement systems described herein. The computing device 1170 may include a processor 1171, a memory 1172, a storage device 1173, one or more input devices 1174, and one or more output devices 1175. The computing device 1170 may include a bus 1176 or a similar device to interconnect the components for communication. The processor 1171 is operable to execute computer program instructions and perform operations described by the computer program instructions. As an example, the processor 1171 may be a conventional device such as a central processing unit. The memory 1172 may be a volatile, highspeed, short-term information storage device such as a random-access memory module. The storage device 1173 may be a non-volatile information storage device such as a hard drive or a solid-state drive. The input devices 1174 may include any type of human-machine interface such as buttons, switches, a keyboard, a mouse, a touchscreen input device, a gestural input device, or an audio input device. The output devices 1175 may include any type of device operable to provide an indication to a user regarding an operating state, such as a display screen or an audio output.

As described above, one aspect of the present technology is the gathering and use of data available from various sources to train automated systems and to use automated systems to perform actions on behalf of users. The present disclosure contemplates that in some instances, this gathered data is used to train automated systems or is used by trained automated systems at run-time may include personal information data that uniquely identifies or can be used to contact or locate a specific person. Such personal information data can include demographic data, location-based data, telephone numbers, email addresses, twitter ID's, home addresses, data or records relating to a user's health or level of fitness (e.g., vital signs measurements, medication information, exercise information), date of birth, or any other identifying or personal information.

The present disclosure recognizes that the use of such personal information data, in the present technology, can be used to the benefit of users. For example, the personal information data can be used to train the automated system in accordance with user preferences or to perform functions on behalf of users based on user preferences. Further, other uses for personal information data that benefit the user are also contemplated by the present disclosure.

The present disclosure contemplates that the entities responsible for the collection, analysis, disclosure, transfer, storage, or other use of such personal information data will comply with well-established privacy policies and/or privacy practices. In particular, such entities should implement and consistently use privacy policies and practices that are generally recognized as meeting or exceeding industry or governmental requirements for maintaining personal information data private and secure. Such policies should be easily accessible by users, and should be updated as the collection and/or use of data changes. Personal information from users should be collected for legitimate and reasonable uses of the entity and not shared or sold outside of those legitimate uses. Further, such collection/sharing should occur after receiving the informed consent of the users. Additionally, such entities should consider taking any needed steps for safeguarding and securing access to such personal information data and ensuring that others with access to the personal information data adhere to their privacy policies and procedures. Further, such entities can subject themselves to evaluation by third parties to certify their adherence to widely accepted privacy policies and practices. In addition, policies and practices should be adapted for the particular types of personal information data being collected and/or accessed and adapted to applicable laws and standards, including jurisdiction-specific considerations. For instance, in the US, collection of or access to certain health data may be governed by federal and/or state laws, such as the Health Insurance Portability and Accountability Act (HIPAA); whereas health data in other countries may be subject to other regulations and policies and should be handled accordingly. Hence different privacy practices should be maintained for different personal data types in each country.

Despite the foregoing, the present disclosure also contemplates embodiments in which users selectively block the use of, or access to, personal information data. That is, the present disclosure contemplates that hardware and/or software elements can be provided to prevent or block access to such personal information data. For example, in the case of run-time operation of automated systems, the present technology can be configured to allow users to select to "opt in" or "opt out" of participation in the collection of personal information data during registration for services or anytime thereafter. In another example, users can select not to provide personal information for use in tailoring run-time operation of an automated system. In yet another example, users can select to limit the length of time that personal data is maintained or entirely prohibit the use of personal data to tailor run-time operation of an automated system. In addition to providing "opt in" and "opt out" options, the present disclosure contemplates providing notifications relating to the access or use of personal information. For instance, a user may be notified upon downloading an app that their personal information data will be accessed and then reminded again just before personal information data is accessed by the app.

Moreover, it is the intent of the present disclosure that personal information data should be managed and handled in a way to minimize risks of unintentional or unauthorized access or use. Risk can be minimized by limiting the collection of data and deleting data once it is no longer needed. In addition, and when applicable, including in certain health related applications, data de-identification can be used to protect a user's privacy. De-identification may be facilitated, when appropriate, by removing specific identifiers (e.g., date of birth, etc.), controlling the amount or specificity of data stored (e.g., collecting location data a city level rather than at an address level), controlling how data is stored (e.g., aggregating data across users), and/or other methods.

Therefore, although the present disclosure broadly covers use of personal information data to implement one or more various disclosed embodiments, the present disclosure also contemplates that the various embodiments can also be implemented without the need for accessing such personal information data. That is, the various embodiments of the present technology are not rendered inoperable due to the lack of all or a portion of such personal information data. For example, automated systems can be trained or controlled at run-time by inferring preferences based on non-personal information data or a bare minimum amount of personal information, such as the request made by the device associated with a user, other non-personal information available to the automated system, or publicly available information.

What is claimed is:

1. A method, comprising:
    obtaining first sensor outputs that represent actual states of a dynamic object using a first sensor that is located in the dynamic object;
    storing actual state values for the dynamic object that are based on the first sensor outputs;
    obtaining a second sensor output using a second sensor that is located in a subject vehicle, wherein the second sensor output represents an observation of the dynamic object;
    determining estimated locations of the dynamic object based on the second sensor output using a sensing algorithm;
    storing estimated location values corresponding to the estimated locations of the dynamic object;
    defining training samples that include the actual state values, the actual state values including an actual location value for the dynamic object at a time point, a respective one of the estimated location values corresponding to the time point, and an actual error value that is defined as a difference between the actual location value and the respective one of the estimated location values;
    training a machine learning model using the training samples such that the machine learning model is configured to determine a condition-dependent error distribution that is conditioned on inputs that represent simulated states of a simulation and represents an error during determination of estimated locations of simulated dynamic objects; and
    subsequent to training the machine learning model, performing one or more iterations of a simulation that includes:
        determining an error value using the machine learning model,
        determining a simulated sensing system output using the error value, and
        controlling operation of a simulated subject vehicle based on the simulated sensing system output.

2. The method of claim 1, wherein training the machine learning model is performed by minimizing a loss function that is based on a log-likelihood of a time-series of error samples from the condition-dependent error distribution.

3. The method of claim 1, wherein the condition-dependent error distribution is described by a mean error value and a standard deviation value.

4. The method of claim 1, wherein the one or more iterations of the simulation also include:
    determining a condition-dependent error distribution for a current time step using the machine learning model using simulation states for the current time step as the inputs, and
    sampling the error value from the condition-dependent error distribution for the current time step.

5. The method of claim 4, wherein the machine learning model is configured to determine the condition-dependent error distribution for the current time step based further on a prior error value.

6. The method of claim 5, wherein the prior error value is sampled from the condition-dependent error distribution from an immediately prior time step relative to the current time step.

7. The method of claim 1, wherein storing the actual state values comprises storing the actual state values using a first data recorder that is associated with the dynamic object and storing the estimated location values comprises storing the estimated location values using a second data recorder that is associated with the subject vehicle.

8. A non-transitory computer-readable storage device including program instructions executable by one or more processors that, when executed, cause the one or more processors to perform operations, the operations comprising:
    obtaining first sensor outputs that represent actual states of a dynamic object using a first sensor that is located in the dynamic object;
    storing actual state values for the dynamic object that are based on the first sensor outputs;
    obtaining a second sensor output using a second sensor that is located in a subject vehicle, wherein the second sensor output represents an observation of the dynamic object;
    determining estimated locations of the dynamic object based on the second sensor output using a sensing algorithm;
    storing estimated location values corresponding to the estimated locations of the dynamic object;
    defining training samples that include the actual state values, the actual state values including an actual location value for the dynamic object at a time point, a respective one of the estimated location values corresponding to the time point, and an actual error value that is defined as a difference between the actual location value and the respective one of the estimated location values;
    training a machine learning model using the training samples such that the machine learning model is configured to determine a condition-dependent error distribution that is conditioned on inputs that represent simulated states of a simulation and represents an error during determination of estimated locations of simulated dynamic objects; and subsequent to training the machine learning model, performing one or more iterations of a simulation that includes:
   determining an error value using the machine learning model,
   determining a simulated sensing system output using the error value, and
   controlling operation of a simulated subject vehicle based on the simulated sensing system output.

9. The non-transitory computer-readable storage device of claim 8, wherein training the machine learning model is performed by minimizing a loss function that is based on a log-likelihood of a time-series of error samples from the condition-dependent error distribution.

10. The non-transitory computer-readable storage device of claim 8, wherein the condition-dependent error distribution is described by a mean error value and a standard deviation value.

11. The non-transitory computer-readable storage device of claim 8, wherein the one or more iterations of the simulation also include:
   determining a condition-dependent error distribution for a current time step using the machine learning model using simulation states for the current time step as the inputs, and
   sampling the error value from the condition-dependent error distribution for the current time step.

12. The non-transitory computer-readable storage device of claim 11, wherein the machine learning model is configured to determine the condition-dependent error distribution for the current time step based further on a prior error value.

13. The non-transitory computer-readable storage device of claim 11, wherein the prior error value is sampled from the condition-dependent error distribution from an immediately prior time step relative to the current time step.

14. The non-transitory computer-readable storage device of claim 8, wherein storing the actual state values comprises storing the actual state values using a first data recorder that is associated with the dynamic object and storing the estimated location values comprises storing the estimated location values using a second data recorder that is associated with the subject vehicle.

15. A system, comprising:
   a memory; and
   one or more processors that are configured to execute instructions that are stored in the memory, wherein the instructions, when executed, cause the one or more processors to:
      obtain first sensor outputs that represent actual states of a dynamic object using a first sensor that is located in the dynamic object;
      store actual state values for the dynamic object that are based on the first sensor outputs;
      obtain a second sensor output using a second sensor that is located in a subject vehicle, wherein the second sensor output represents an observation of the dynamic object;
      determine estimated locations of the dynamic object based on the second sensor output using a sensing algorithm;
      store estimated location values corresponding to the estimated locations of the dynamic object;
      define training samples that include the actual state values, the actual state values including an actual location value for the dynamic object at a time point, a respective one of the estimated location values corresponding to the time point, and an actual error value that is defined as a difference between the actual location value and the respective one of the estimated location values;
      train a machine learning model using the training samples such that the machine learning model is configured to determine a condition-dependent error distribution that is conditioned on inputs that represent simulated states of a simulation and represents an error during determination of estimated locations of simulated dynamic objects; and
   subsequent to training the machine learning model, perform one or more iterations of a simulation that includes:
      determining an error value using the machine learning model,
      determining a simulated sensing system output using the error value, and
      controlling operation of a simulated subject vehicle based on the simulated sensing system output.

16. The system of claim 15, wherein training the machine learning model is performed by minimizing a loss function that is based on a log-likelihood of a time-series of error samples from the condition-dependent error distribution.

17. The system of claim 15, wherein the condition-dependent error distribution is described by a mean error value and a standard deviation value.

18. The system of claim 15, wherein the one or more iterations of the simulation also include:
   determining a condition-dependent error distribution for a current time step using the machine learning model using simulation states for the current time step as the inputs, and
   sampling the error value from the condition-dependent error distribution for the current time step.

19. The system of claim 18, wherein the machine learning model is configured to determine the condition-dependent error distribution for the current time step based further on a prior error value.

20. The system of claim 18, wherein the prior error value is sampled from the condition-dependent error distribution from an immediately prior time step relative to the current time step.

21. The system of claim 15, wherein storing the actual state values comprises storing the actual state values using a first data recorder that is associated with the dynamic object and storing the estimated location values comprises storing the estimated location values using a second data recorder that is associated with the subject vehicle.

* * * * *